United States Patent
Hwang

(10) Patent No.: US 12,089,337 B2
(45) Date of Patent: Sep. 10, 2024

(54) CIRCUIT BOARD

(71) Applicant: SAMSUNG ELECTRO-MECHANICS CO., LTD., Suwon-si (KR)

(72) Inventor: Jun Oh Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 157 days.

(21) Appl. No.: 17/683,569

(22) Filed: Mar. 1, 2022

(65) Prior Publication Data
US 2023/0105030 A1 Apr. 6, 2023

(30) Foreign Application Priority Data
Oct. 6, 2021 (KR) .................... 10-2021-0132446

(51) Int. Cl.
*H05K 1/18* (2006.01)
*H05K 1/02* (2006.01)
*H05K 1/11* (2006.01)

(52) U.S. Cl.
CPC ........... *H05K 1/183* (2013.01); *H05K 1/0298* (2013.01); *H05K 1/115* (2013.01); *H05K 1/185* (2013.01); *H05K 2201/09036* (2013.01)

(58) Field of Classification Search
CPC ...... H05K 1/183; H05K 1/0298; H05K 1/115; H05K 2201/09036; H05K 1/185; H05K 1/182–188
See application file for complete search history.

(56) References Cited

U.S. PATENT DOCUMENTS

| 5,225,709 A * | 7/1993 | Nishiuma | H01L 24/48 257/692 |
| 5,646,828 A * | 7/1997 | Degani | H01L 23/5385 257/E23.008 |
| 6,184,463 B1* | 2/2001 | Panchou | H01L 22/00 174/548 |
| 2005/0122698 A1* | 6/2005 | Ho | H05K 1/185 361/764 |
| 2005/0230711 A1* | 10/2005 | Chang | H05K 1/115 257/210 |
| 2008/0273314 A1* | 11/2008 | Cho | H05K 1/185 361/764 |
| 2009/0316373 A1* | 12/2009 | Kim | H01L 23/5389 361/764 |

(Continued)

FOREIGN PATENT DOCUMENTS

| KR | 10-2016-0004157 A | 1/2016 |
| KR | 10-1942737 B1 | 1/2019 |

*Primary Examiner* — Steven T Sawyer
(74) *Attorney, Agent, or Firm* — Morgan, Lewis & Bockius LLP

(57) ABSTRACT

A circuit board includes a core portion including a first cavity formed in one surface, and a second cavity formed in the other surface opposing the one surface and having a diameter different from a diameter of the first cavity; a first metal layer disposed on the one surface of the core portion; a second metal layer buried in the core portion; and a third metal layer disposed on the other surface of the core portion, wherein each of the first and second cavities of the core portion exposes at least a portion of the second metal layer.

17 Claims, 12 Drawing Sheets

(56) References Cited

U.S. PATENT DOCUMENTS

| | | | |
|---|---|---|---|
| 2011/0036626 A1* | 2/2011 | Asai | H05K 3/4602 174/264 |
| 2011/0116246 A1* | 5/2011 | Lee | H05K 1/18 156/60 |
| 2015/0296625 A1* | 10/2015 | Jung | H05K 3/305 361/762 |
| 2016/0007449 A1 | 1/2016 | Kim et al. | |
| 2019/0043847 A1 | 2/2019 | Lee et al. | |
| 2021/0037652 A1* | 2/2021 | Yamaguchi | H05K 1/115 |
| 2023/0049806 A1* | 2/2023 | Joung | H05K 3/429 |

* cited by examiner

CIRCUIT BOARD

CROSS-REFERENCE TO RELATED APPLICATION(S)

This application claims benefit of priority to Korean Patent Application No. 10-2021-0132446 filed on Oct. 6, 2021 in the Korean Intellectual Property Office, the disclosure of which is incorporated herein by reference in its entirety.

TECHNICAL FIELD

The present disclosure relates to a circuit board.

BACKGROUND

In order to respond to the recent trend for lightness, miniaturization, and the like, of mobile devices, the need to implement lightness, thinning, shortening, and miniaturization of circuit boards mounted thereon is also gradually increasing.

Meanwhile, as mobile devices are becoming lighter, thinner, shorter, and smaller, in response to technical demands, a technology in which electronic components such as ICs, active devices, passive devices, or the like are inserted into a board is required in terms of shortening a connection path between the electronic components and improving noise-related problems. In recent years, research into a technology for embedding components in a board using various methods has continued.

In particular, a board including a cavity is formed in order to insert various components into the board, and a technique using a blast process or the like is performed to form the cavity.

SUMMARY

An aspect of the present disclosure is to provide a circuit board including a microcircuit and/or a micro via.

Another aspect of the present disclosure is to provide a circuit board on which a plurality of electronic components are efficiently mounted by processing a plurality of cavities having different diameters.

According to an aspect of the present disclosure, a circuit board includes a core portion including a first cavity disposed in one surface, and a second cavity disposed in the other surface opposing the one surface and having a diameter different from a diameter of the first cavity; a first metal layer disposed on the one surface of the core portion; a second metal layer buried in the core portion; and a third metal layer disposed on the other surface of the core portion, wherein at least a portion of the second metal layer extends from each of the first and second cavities of the core portion.

According to an aspect of the present disclosure, a circuit board includes a core portion including a first core layer having a first cavity disposed therein, and a second core layer having a second cavity disposed therein, the second cavity having a diameter different from a diameter of the first cavity; a first metal layer disposed on one surface of the first core layer; a second metal layer disposed between the first core layer and the second core layer; and a third metal layer disposed on one surface of the second core layer, wherein at least a portion of the first core layer extends beyond the second core layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
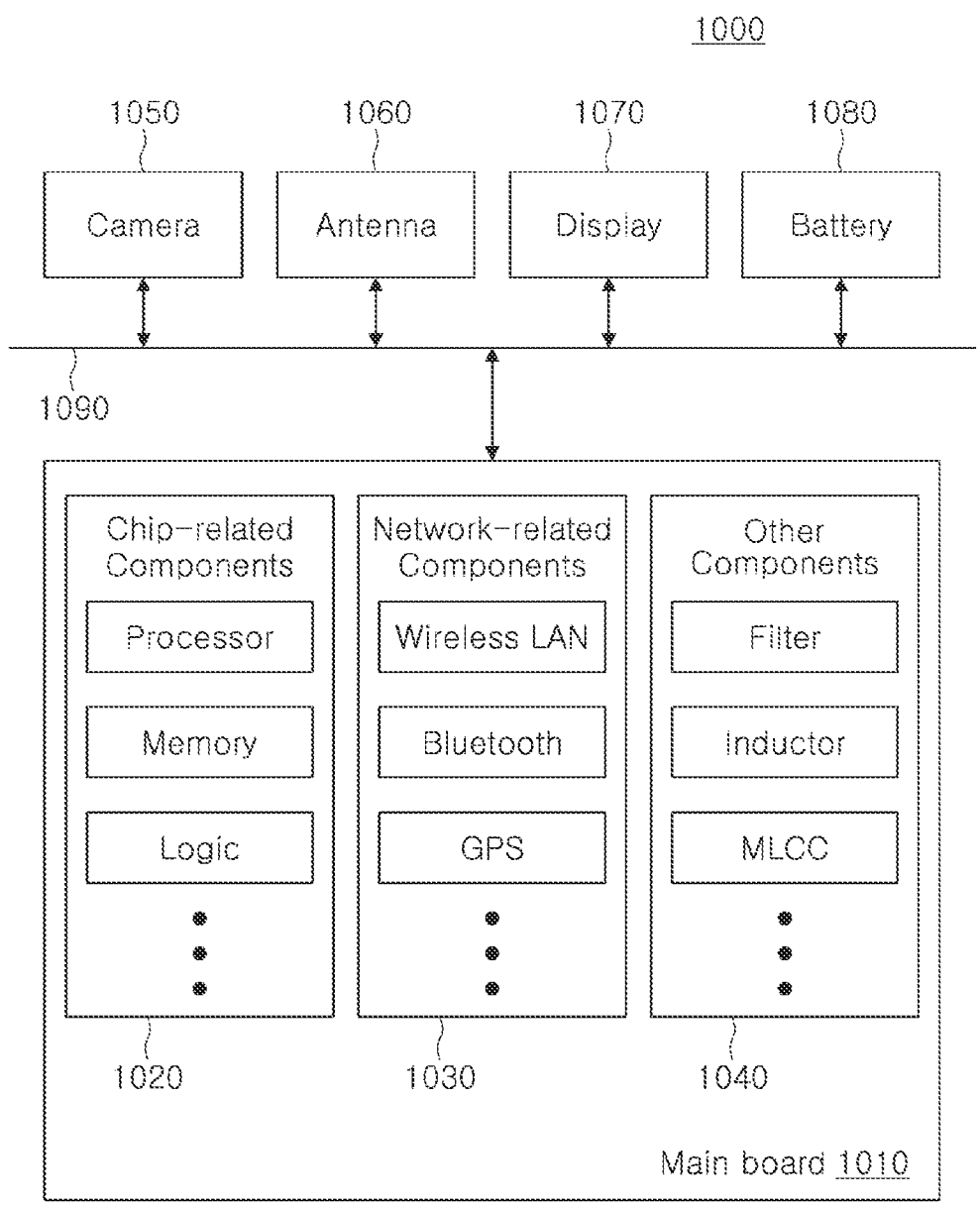
FIG. 1 is a view schematically illustrating an example of an electronic device system.

Hereinafter, the present disclosure will be described with reference to the accompanying drawings. Shapes, sizes, and the like of the elements in the drawings may be exaggerated or reduced for more clear description.

In addition, in assigning reference numbers to elements of the accompanying drawings, like reference numerals will denote like elements as much possible, even though they are indicated in different drawings.

Moreover, in describing the present disclosure, if it is determined that the detailed description of the related well-known technology may unnecessarily obscure the gist of the present disclosure, the detailed description thereof will be omitted.

Electronic Device

FIG. 1 is a block diagram schematically illustrating an example of an electronic device system.

Referring to the drawing, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 maybe combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
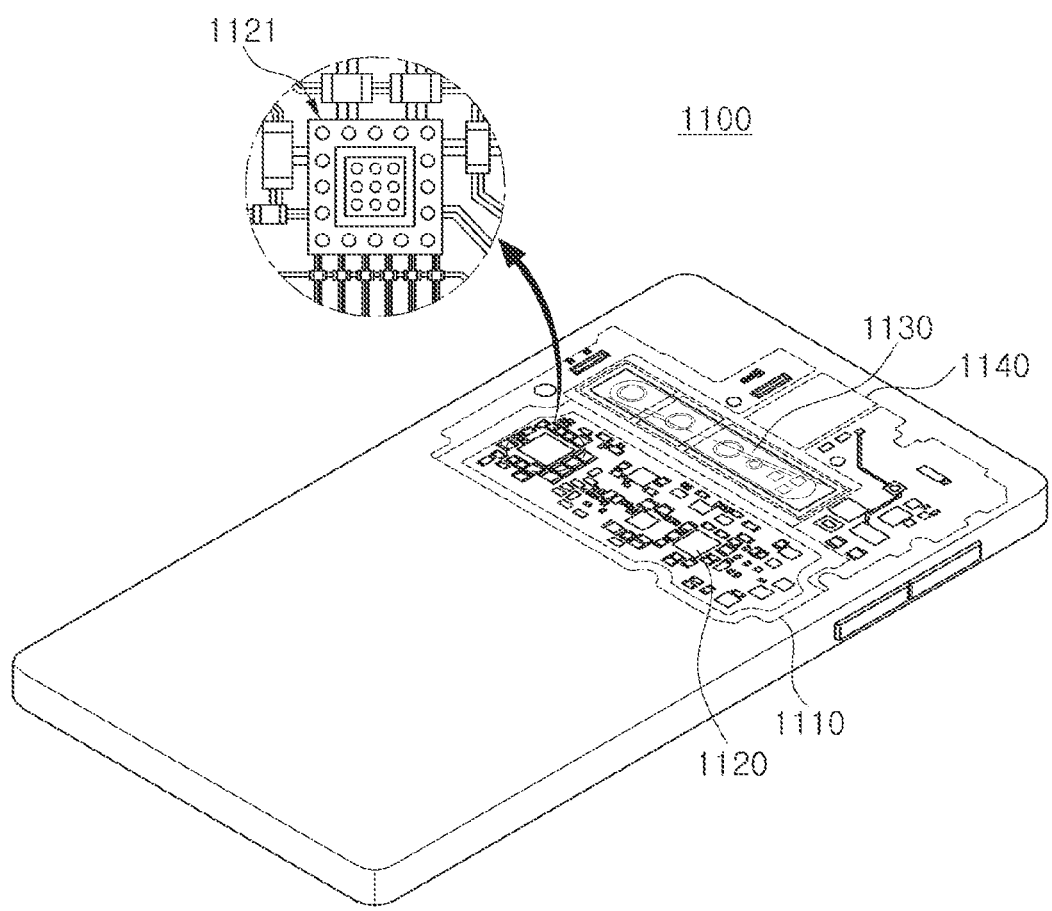
FIG. 2 is a view schematically illustrating an example of an electronic device.

FIG. 2 is a perspective view schematically illustrating an example of an electronic device.

Referring to the drawing, an electronic device may be, for example, a smartphone 1100. A main board 1110 may be accommodated in the smartphone 1100, and various electronic components 1120 maybe physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, an antenna module 1121, but are not limited thereto. The antenna module 1121 maybe provided as a surface-mounted form in which a semiconductor chip or a passive component is mounted on a printed circuit board, but the present disclosure is not limited thereto. The electronic device is not necessarily limited to the smartphone 1100, but may be other electronic devices as described above.

Circuit Board

Figure 3:
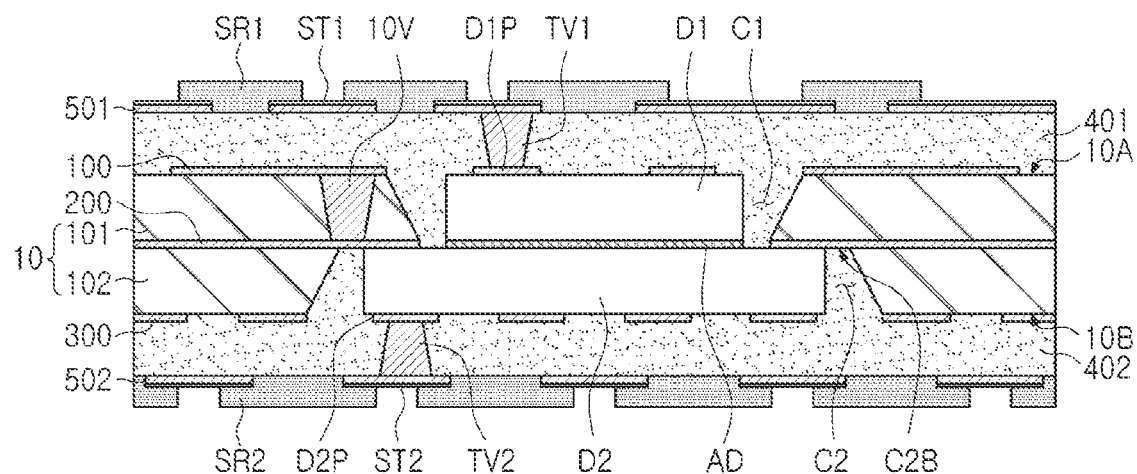
FIG. 3 is a view schematically illustrating an example of a circuit board according to the present disclosure.

FIG. 3 is a view schematically illustrating an example of a circuit board according to the present disclosure.

Referring to the drawings, a circuit board according to the present disclosure may include a core portion 10 including a first cavity C1 formed on one surface 10A, and a second cavity C2 formed on the other surface 10B opposing the one surface 10A and having a diameter different from a diameter of the first cavity C1; a first metal layer 100 disposed on the one surface 10A of the core portion; a second metal layer 200 buried in the core portion 10; and a third metal layer 300 disposed on the other surface 10B of the core portion.

In this case, each of the first and second cavities C1 and C2 of the core portion 10 may expose at least a portion of the second metal layer 200 (or at least a portion of the second metal layer 200 may extend from each of the first and second cavities C1 and C2 of the core portion 10), but the present disclosure is not limited thereto.

Also, the core portion 10 may include a first core layer 101 having the first cavity C1 formed therein, and a second core layer 102 having the second cavity C2 formed therein. For example, the first and second core layers 101 and 102 may be disposed on both surfaces of the second metal layer 200 buried in the core portion 10.

In addition, the second cavity C2 formed on the other surface 10B of the core portion 10 may have a bottom surface C2B in a region adjacent to the first cavity C1, and at least a portion of the second metal layer 200 may be exposed to the bottom surface C2B of the second cavity C2.

First and second electronic components D1 and D2 may be disposed in each of the first and second cavities C1 and C2 of the core portion 10. In this case, a diameter of each of the first and second cavities C1 and C2 may be determined to correspond to a size of each of the first and second electronic components D1 and D2, but the present disclosure is not limited thereto.

In this case, each of the first and second electronic components D1 and D2 may correspond to one of a passive component, an active component, a semiconductor die, and a semiconductor chip, but the present disclosure is not limited thereto.

The first cavity C1 of the core portion 10 may have a diameter of a region close to the second metal layer 200, smaller than a diameter of a region close to the first metal layer 100, and the second cavity C2 of the core portion 100 may have a diameter of a region close to the second metal layer 200, smaller than a diameter of a region close to the third metal layer 300, but are not limited thereto.

Also, an adhesive layer AD may be disposed between the first and second electronic components D1 and D2. For example, the first and second electronic components D1 and D2 may be connected to each other by the adhesive layer AD, and disposed in each of the first and second cavities C1 and C2.

In addition, at least a portion of at least one of the first and second electronic components D1 and D2 may be in contact with the second metal layer 200 buried in the core portion 10.

As described above, a plurality of electronic components maybe efficiently mounted by processing a plurality of cavities having different diameters, but the present disclosure is not limited thereto.

First and second insulating materials 401 and 402 in which at least a portion of the core portion 10 buries the first and second electronic components D1 and D2 may be disposed on the one surface and the other surfaces 10A and 10B of the core portion 10, respectively.

In addition, first and second circuit layers 501 and 502 may be disposed on one surface of each of the first and second insulating materials 401 and 402, and first and second surface treatment layers ST1 and ST2 may be disposed on one surface of at least a portion of the first and second circuit layers 501 and 502, respectively.

In addition, first and second solder resist layers SR1 and SR2 may be disposed on one surface of each of the first and second circuit layers 501 and 502, and at least a portion of the first and second surface treatment layers ST1 and ST2 may be exposed from the first and second solder resist layers SR1 and SR2, but the present disclosure is not limited thereto.

Openings may be formed in the first and second solder resist layers SR1 and SR2 to expose at least portions of the first and second circuit layers 501 and 502 externally. In this case, the first and second surface treatment layers ST1 and ST2 may be disposed on the first and second circuit layers 501 and 502 exposed through the openings, respectively, but the present disclosure is not limited thereto.

Each of the first and second electronic components D1 and D2 may include connection pads D1P and D2P on one surface adjacent to each of the first and second circuit layers 501 and 502. For example, the connection pads D1P and D2P of the first and second electronic components may be formed in opposite directions, but are not limited thereto.

In addition, first and second through-vias TV1 and TV2 respectively connecting the second and second circuit layers 501 and 502 to the connection pads D1P and D2P of the first and second electronic components, and respectively passing through the first and second insulating materials 401 and 402 may be further included, but the present disclosure is not limited thereto.

In this case, each of the first and second through-vias TV1 and TV2 may be formed to have a diameter of a region close to the connection pads D1P and D2P of each of the first and second electronic components, smaller than a diameter of a region close to each of the first and second circuit layers 501 and 502. For example, the diameter of each of the first and second through-vias TV1 and TV2 may increase in directions respectively from the second metal layer 200 to the first and second circuit layers 501 and 502, but the present disclosure is not limited thereto.

The core portion 10 may further include a via 10V connecting the first and second metal layers 100 and 200 to each other, and the via 10V may be formed to have a diameter of a region close to the second metal layer 200, smaller than a diameter of a region close to the first metal layer 100. For example, although not illustrated, the diameter of the via 10V passing through the core portion 10 may increase in directions respectively from the second metal layer 200 to the first and third metal layers 100 and 300, but the present disclosure is not limited thereto.

Each of the core portion 10 and the first and second insulating materials 401 and 402 in the circuit board may use at least one of a thermosetting resin such as an epoxy resin, a thermoplastic resin such as polyimide, or a resin in which these resins together with an inorganic filler are impregnated into a core material such as glass fiber (glass cloth, glass fabric) or the like, for example, prepreg, Ajinomoto Build-up Film (ABF), FR-4, and bismaleimide triazine (BT).

In addition, in the first to third metal layers 100, 200, and 300, a conductive material such as copper (Cu), aluminum (Al), silver (Ag), tin (Sn), gold (Au), nickel (Ni), lead (Pb), titanium (Ti), palladium (Pd), alloys thereof, or the like may be used, but the present disclosure is not limited thereto. In particular, the first to third metal layers 100, 200, and 300 maybe formed of a carrier copper foil, and disposed on the first and second core layers 101 and 102.

In addition, in the first and second circuit layers 501 and 502, the first and second through-vias TV1 and TV2, the via 10V of the core portion, and the connection pads D1P and D2P of the first and second electronic components in the circuit board according to the present disclosure, a conductive material such as copper (Cu), aluminum (Al), silver (Ag), tin (Sn), gold (Au), nickel (Ni), lead (Pb), titanium (Ti), palladium (Pd), alloys thereof, or the like may be used, and a non-insulating material such as carbon fiber or the like may be used in addition to a metallic material. Even in an electroless plating layer and an electrolytic plating layer to be filled in the through-vias and the via, copper (Cu), aluminum (Al), silver (Ag), tin (Sn), gold (Au), nickel (Ni), lead (Pb), titanium (Ti), palladium (Pd), or alloys thereof may be included.

In addition, the first and second circuit layers 501 and 502, the first and second through-vias TV1 and TV2, and the via 10V of the core portion in the circuit board according to the present disclosure may include an electroless plating layer and an electrolytic plating layer, respectively. The electroless plating layer may serve as a seed layer for the electrolytic plating layer, but the present disclosure is not limited thereto.

The first and second surface treatment layers ST1 and ST2 formed on at least a portion of one surface of the first and second circuit layers 501 and 502 may include different compositions from those of the first and second circuit layers 501 and 502, respectively. For example, each of the first and second circuit layers 501 and 502 may include copper (Cu), and each of the first and second surface treatment layers ST1 and ST2 may include nickel (Ni) or tin (Sn), but are not limited thereto.

The first and second solder resist layers SR1 and SR2 may be formed of a photosensitive material. In addition, a solder resist may have thermosetting and/or photocuring properties, but the present disclosure is not limited thereto.

Figure 4:
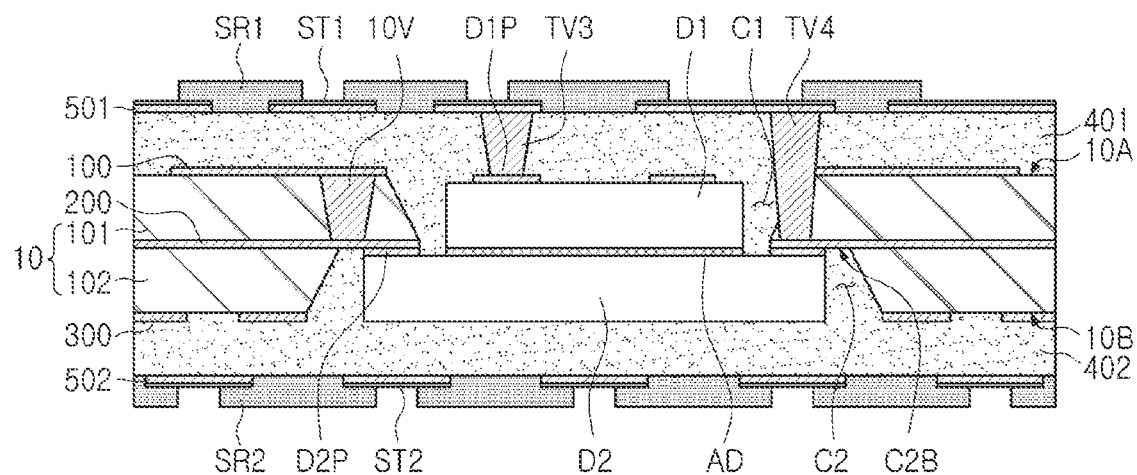
FIG. 4 is a view schematically illustrating an example of a circuit board according to the present disclosure.

FIG. 4 is a view schematically illustrating an example of a circuit board according to the present disclosure.

Referring to the drawings, in a circuit board according to the present disclosure, connection pads D1P and D2P may be respectively disposed on surfaces of first and second electronic components D1 and D2 respectively disposed in first and second cavities C1 and C2 of a core portion 10, adjacent to a first circuit layer 501.

For example, unlike the embodiment illustrated in FIG. 3, the connection pads D1P and D2P of each of the first and second electronic components in this embodiment maybe disposed in the same direction, but the present disclosure is not limited thereto.

In addition, a third through-via TV3 connecting the first circuit layer 501 and the connection pad D1P of the first electronic component D1 and passing through a first insulating material 401, and a fourth through-via TV4 connecting the first circuit layer 501 and the connection pad D2P of the second electronic component D2 and passing through at least a portion of each of the first insulating material 401 and the core portion 10, may be included.

In this case, each of the third and fourth through vias TV3 and TV4 may be formed to have a diameter of a region close to each of the connection pads D1P and D2P of the first and second electronic components, smaller than a diameter of a region close to the first circuit layer 501, but the present disclosure is not limited thereto.

For example, the diameter of each of the third and fourth through-vias TV3 and TV4 may increase in a direction from the first and second electronic components D1 and D2 to the first circuit layer 501, but the present disclosure is not limited thereto.

As described above, a plurality of electronic components may be efficiently mounted by processing a plurality of cavities having different diameters, but the present disclosure is not limited thereto.

In addition, in each of the third and fourth through-vias TV3 and TV4 of the circuit board according to the present disclosure, a conductive material such as copper (Cu), aluminum (Al), silver (Ag), tin (Sn), gold (Au), nickel (Ni), lead (Pb), titanium (Ti), palladium (Pd), alloys thereof, or the like may be used, and a non-insulating material such as carbon fiber or the like may be used in addition to a metallic material. Even in an electroless plating layer and an electrolytic plating layer to be filled in the through-vias, copper (Cu), aluminum (Al), silver (Ag), tin (Sn), gold (Au), nickel (Ni), lead (Pb), titanium (Ti), palladium (Pd), or alloys thereof may be included.

In addition, each of the third and fourth through-vias TV3 and TV4 in the circuit board may include an electroless plating layer and an electrolytic plating layer. The electroless plating layer may serve as a seed layer for the electrolytic plating layer, but the present disclosure is not limited thereto.

Since other descriptions may be applied in substantially the same manner as those described above, detailed descriptions thereof will be omitted.

Figure 5A:
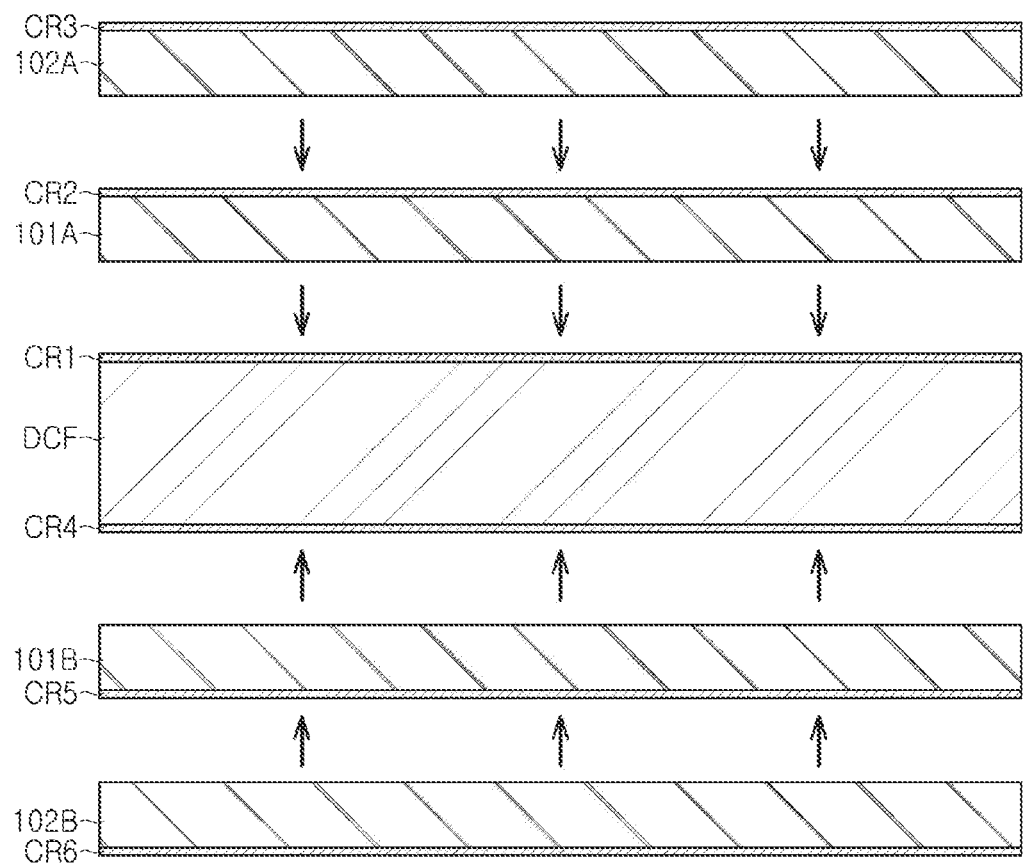
FIGS. 5A to 5C are views schematically illustrating an example of a method of manufacturing a circuit board according to the present disclosure.
Figure 5B:
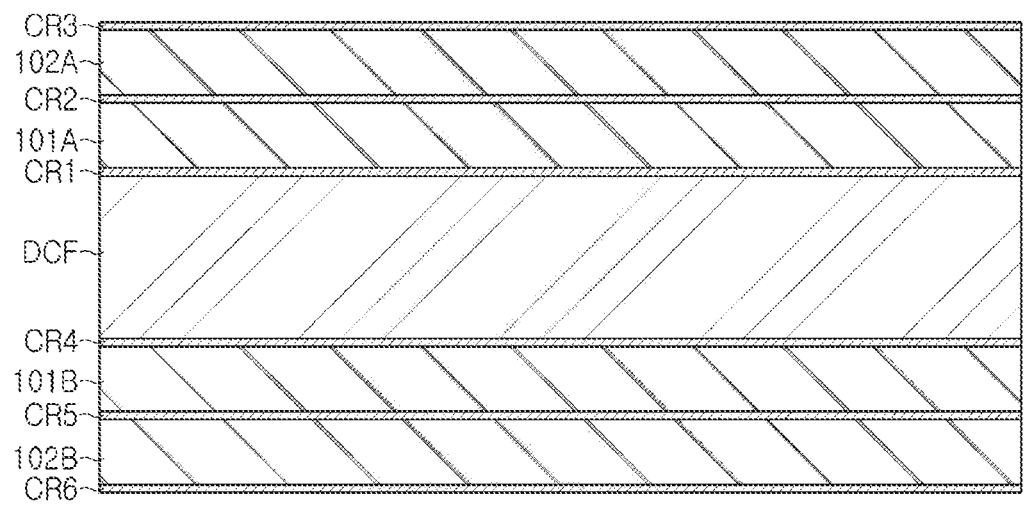
Figure 5C:
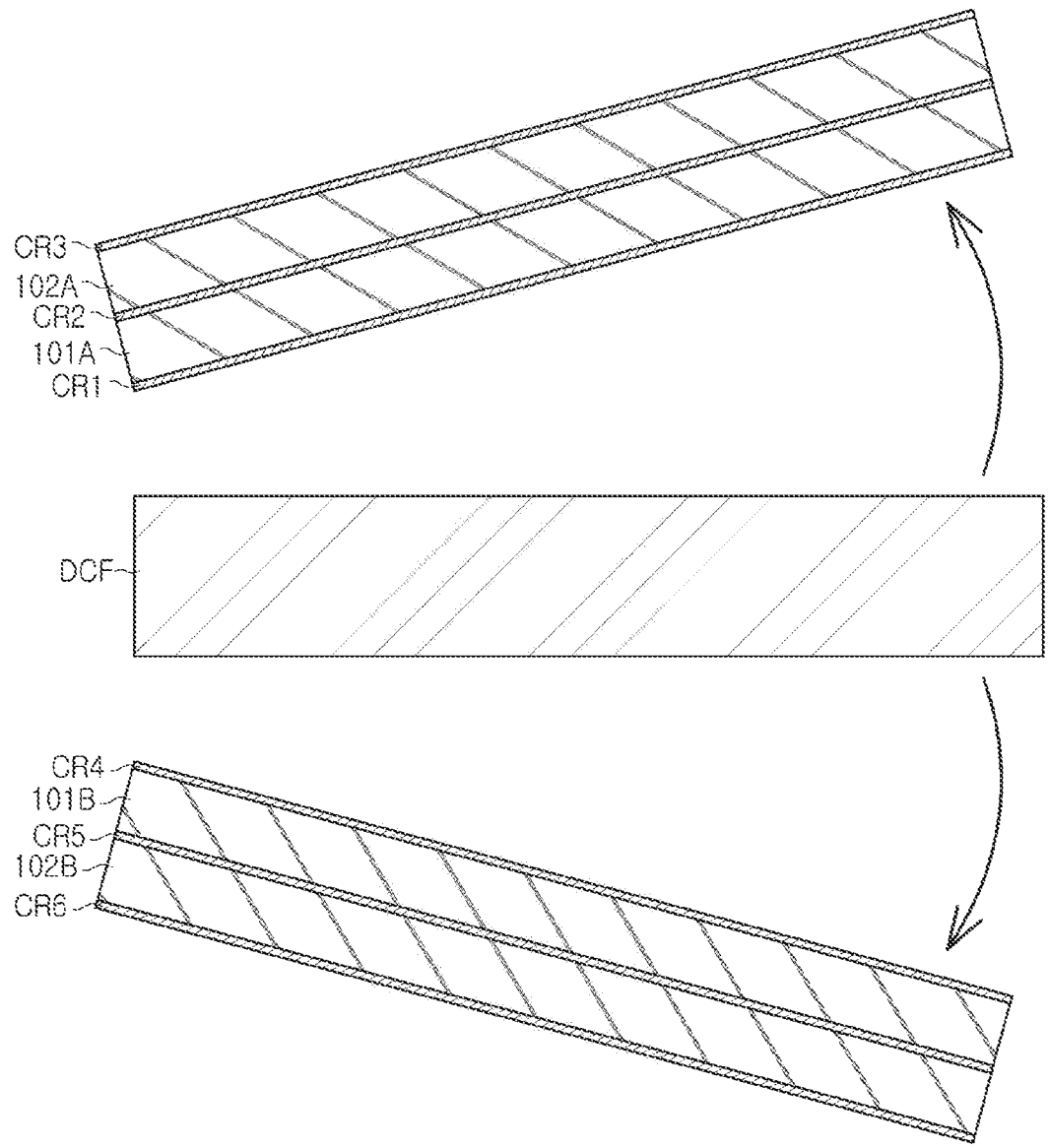

FIGS. 5A to 5C are views schematically illustrating an example of a method of manufacturing a circuit board according to the present disclosure.

A core portion 10 and first to third metal layers 100, 200, and 300 according to the present disclosure may be formed as follows.

First, a detach core DCF in which carrier copper foils CR1 and CR4 are disposed on both surfaces, as illustrated in FIG. 5A, maybe prepared. Then, insulating layers 101A and 101B to which carrier copper foils CR2 and CR5 are respectively attached may be respectively stacked on the carrier copper foils CR1 and CR4 on the both surfaces of the detach core DCF, and insulating layers 102A and 102B to which carrier copper foils CR3 and CR6 are respectively attached may be additionally stacked on one surface of each of the carrier copper foils CR2 and CR5 of the insulating layers 101A and 101B.

Then, only the detach core DCF may be peeled off as illustrated in FIG. 5C, in a state in which three of the carrier copper foils and two of the insulating layers are alternately stacked on the both surfaces of the detach core DCF as illustrated in FIG. 5B. In this case, the carrier copper foils CR1 and CR4 on the both surfaces of the detach core DCF may be also detached from the detach core DCF.

FIG. 5C illustrates a process of forming two stack bodies in which two of the insulating layers and three of the carrier copper foils are alternately stacked, one stack body of which may correspond to a core portion 10 according to the present disclosure.

In this case, the first to third metal layers 100, 200 and 300 of the core portion 10, described above, may correspond to three upper layers CR1, CR2, and CR3 or three lower layers CR4, CR5, and CR6 among the carrier copper foils, and the first and second core layers 101 and 102 of the core portion 10 may correspond to two upper layers 101A and 102A or two lower layers 101B and 102B among the insulating layers, but are not limited thereto.

Since other descriptions may be applied in substantially the same manner as those described above, detailed descriptions thereof will be omitted.

Figure 6A:
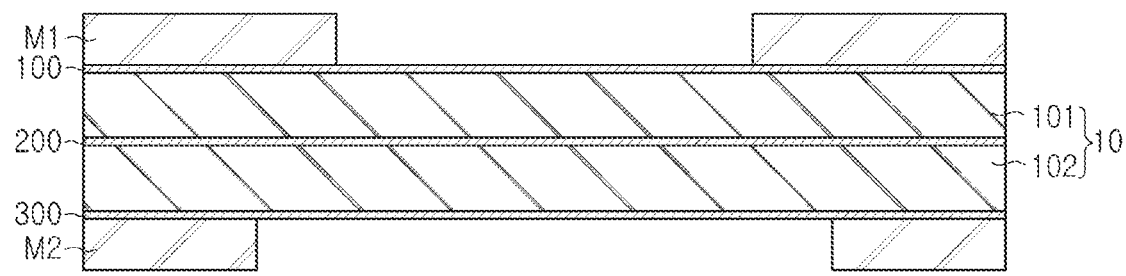
FIGS. 6A to 6C are views schematically illustrating an example of a method of manufacturing a circuit board according to the present disclosure.
Figure 6B:
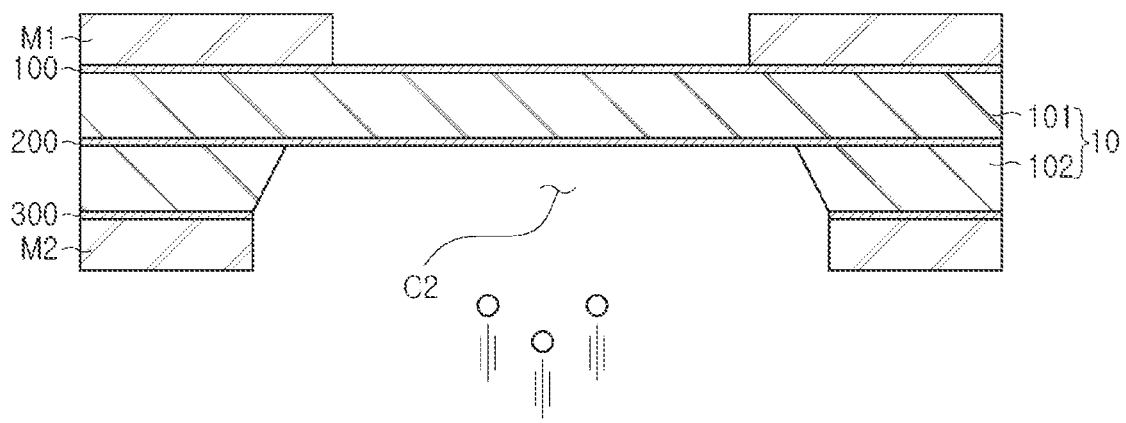
Figure 6C:
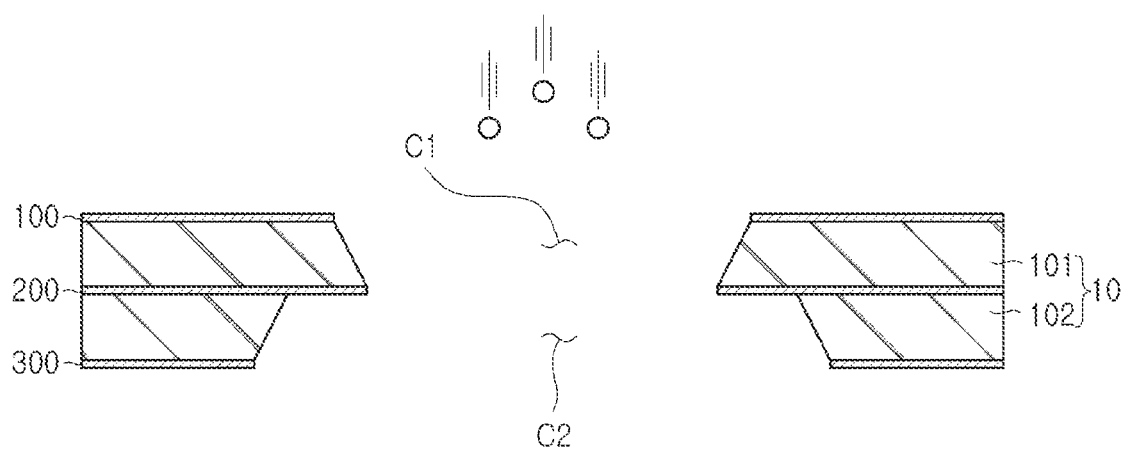

FIGS. 6A to 6C are views schematically illustrating an example of a method of manufacturing a circuit board according to the present disclosure.

Referring to FIG. 6A, in a circuit board according to the present disclosure, first and second masks M1 and M2 may be respectively disposed first and third metal layers 100 and 300 respectively disposed on one surface 10A and the other surface 10B of a core portion 10. In this case, the first and second masks M1 and M2 may serve as resists in respectively forming first and second cavities C1 and C2 in the core portion 10 as will be described later, but are not limited thereto.

First, as illustrated in FIG. 6B, the second cavity C2 maybe formed in a region of a second core layer 102 of the core portion 10, except for a region contacting the second mask M2. In this case, the cavity may be formed using a blast method, but the present disclosure is not limited thereto.

In addition, when the second cavity C2 is formed, a second metal layer 200 buried in the core portion 10 may function as a stopper. For example, the second cavity C2 may be formed up to a depth at which the second metal layer 200 is formed, but the present disclosure is not limited thereto.

Thereafter, as illustrated in FIG. 6C, the first cavity C1 may be formed in a region of a first core layer 101 of the core portion 10, except for a region contacting the first mask M1. In this case, the cavity may be formed using a blast method, but the present disclosure is not limited thereto.

In addition, the first cavity C1 may have a diameter, smaller than a diameter of the second cavity C2, and at least a portion of the second metal layer 200 may be exposed from each of the first and second cavities C1 and C2, but are not limited thereto.

In particular, since the diameter of the first cavity C1 is formed to be smaller than the diameter of the second cavity C2, a step difference may be formed in the core portion 10.

In addition, the first cavity C1 of the core portion 10 may have a diameter of a region close to the second metal layer 200, smaller than a diameter of a region close to the first metal layer 100, and the second cavity C2 of the core portion 100 may have a diameter of a region close to the second metal layer 200, smaller than a diameter of a region close to the third metal layer 300, but are not limited thereto.

A method of measuring the diameters of the first and second cavities C1 and C2 may be as follows.

A diameter of a bottom surface, e.g., the deepest surface, of each of the cavities may be measured multiple times. An arithmetic mean value of values measured a plurality of times may mean a diameter of each of the cavities, but the present disclosure is not limited thereto.

In addition, the arithmetic mean value may be derived by measuring diameters of the bottom surface and an inlet of each of the cavities, e.g., a region closest to the outside. In this case, the derived arithmetic mean value may mean a diameter of each of the cavities, but the present disclosure is not limited thereto. The diameter may be measured by, for example, an optical microscope or a scanning electron microscope (SEM).

Since other descriptions may be applied in substantially the same manner as those described above, detailed descriptions thereof will be omitted.

Figure 7A:
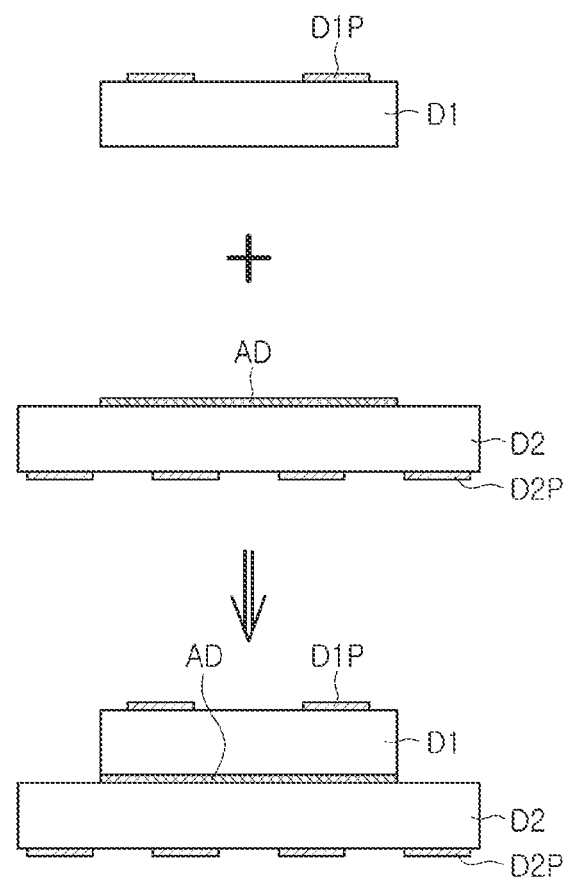
FIGS. 7A and 7B are views schematically illustrating an example of an electronic component mounted on a circuit board according to the present disclosure.
Figure 7B:
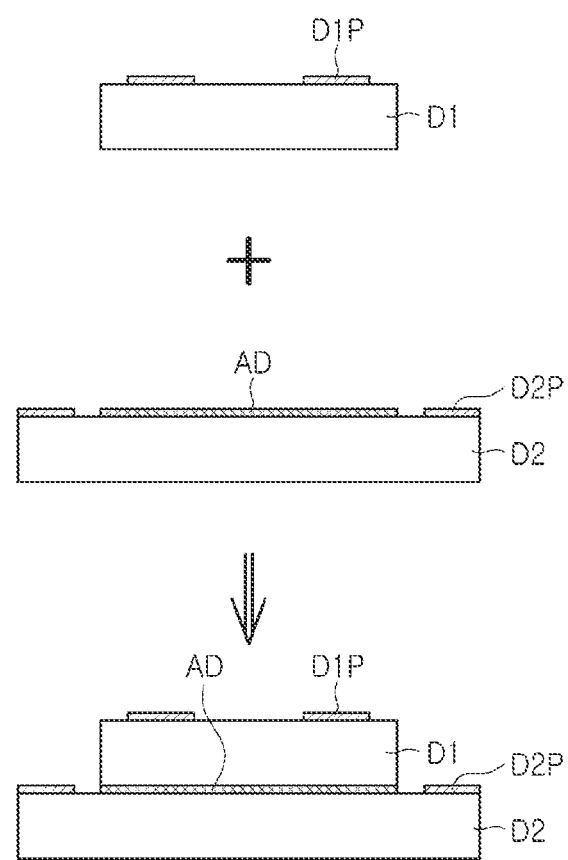

FIGS. 7A and 7B are views schematically illustrating an example of an electronic component mounted on a circuit board according to the present disclosure.

Referring to the drawings, first and second electronic components D1 and D2 maybe connected to each other by an adhesive layer AD. In this case, the adhesive layer AD may be an adhesive tape or an adhesive film using a known material, but the present disclosure is not limited thereto.

Referring to FIG. 7A, first and second electronic components D1 and D2 may be attached in a direction in which connection pads D1P and D2P oppose each other. For example, surfaces of the first and second electronic components D1 and D2 on which the connection pads D1P and D2P are not formed may be connected to each other, but are not limited thereto.

Referring to FIG. 7B, first and second electronic components D1 and D2 may be attached such that connection pads D1P and D2P are disposed in the same direction. For example, a surface on which the connection pad D1P of the first electronic component D1 is not formed may be connected to a surface on which the connection pad D2P of the second electronic component D2 is not formed, but the present disclosure is not limited thereto.

Since other descriptions may be applied in substantially the same manner as those described above, detailed descriptions thereof will be omitted.

Figure 8A:
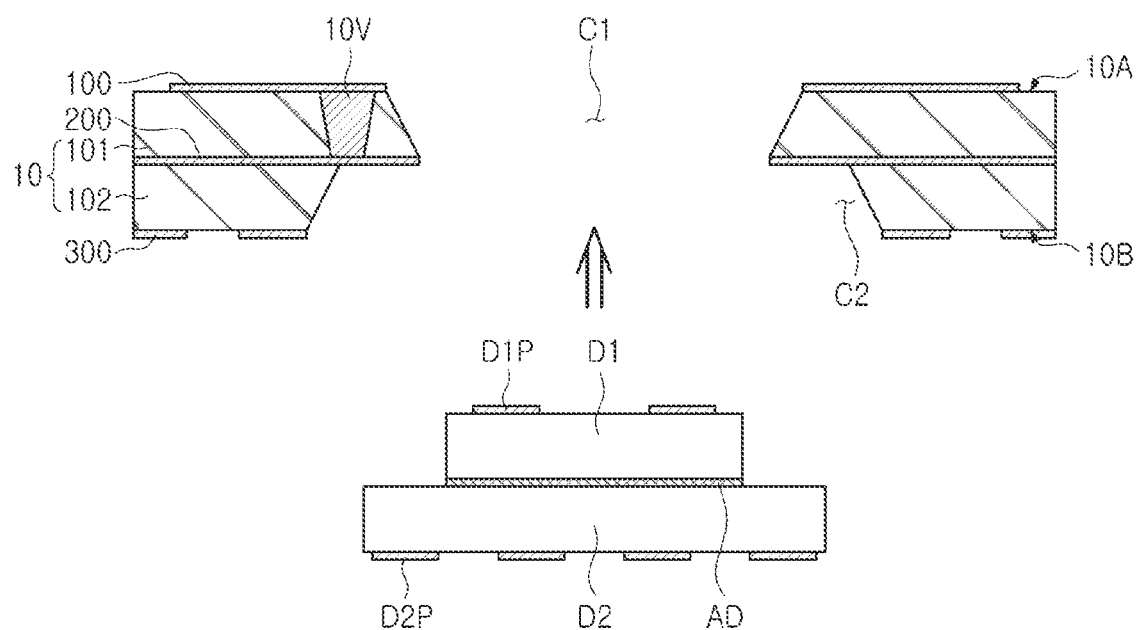
FIGS. 8A to 8C are views schematically illustrating an example of a method of manufacturing a circuit board according to the present disclosure.
Figure 8B:
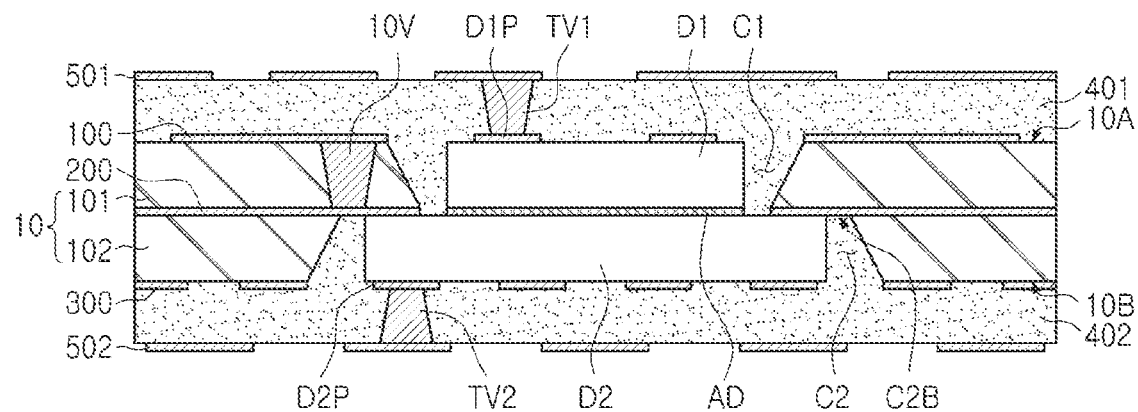
Figure 8C:
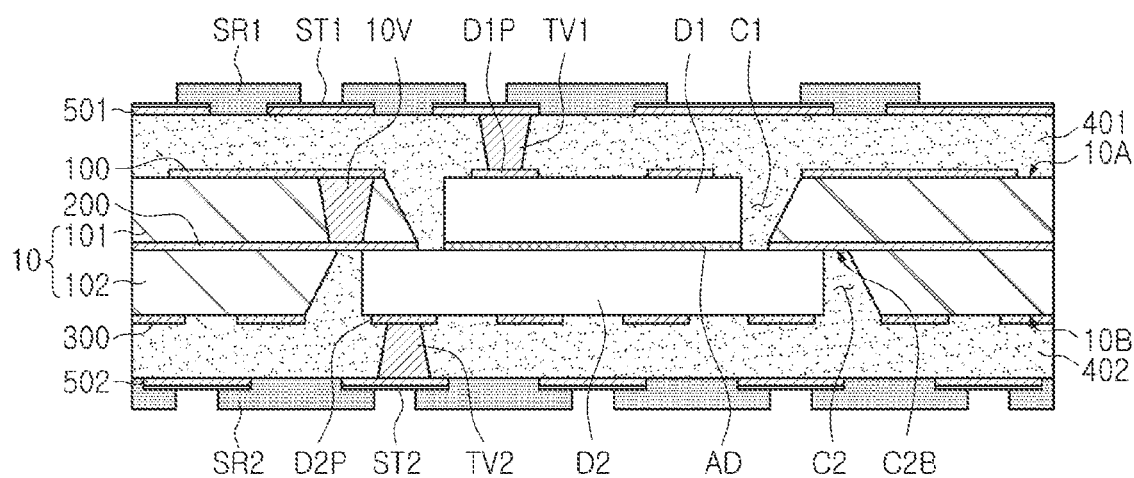

FIGS. 8A to 8C are views schematically illustrating an example of a method of manufacturing a circuit board according to the present disclosure.

The first and second electronic components D1 and D2, connected to each other, prepared in FIG. 7A or FIG. 7B, may be provided in the core portion 10 in which the first and second cavities C1 and C2 illustrated in FIG. 6C are formed.

In this case, as illustrated in FIG. 8A, the first electronic component D1 having a smaller size, among the first and second electronic components D1 and D2 connected to each other, may be first inserted in the second cavity C2 having a diameter, larger than a diameter of the first cavity C1. The core portion 10 having a step difference may expose at least a portion of the second metal layer 200, and the second electronic component D2 may correspond to a component having a size, greater than the diameter of the first cavity C1.

Therefore, when at least a portion of the second electronic component D2 is in contact with the second metal layer 200, the first and second electronic components D1 and D2 may be respectively disposed in the first and second cavities C1 and C2.

As described above, a plurality of electronic components maybe efficiently mounted by processing a plurality of cavities having different diameters, but the present disclosure is not limited thereto.

Although FIGS. 8A to 8C illustrate only an arrangement of electronic components corresponding to the embodiment of FIG. 3, electronic components corresponding to the embodiment of FIG. 4 may be also disposed in the first and second cavities C1 and C2, as illustrated in FIGS. 8A to 8C.

The first and second electronic components D1 and D2 may be respectively disposed in the first and second cavities C1 and C2, may pass through at least a portion of the core portion 10, and a via 10V connecting at least one of the first and third metal layers 100 and 300 and the second metal layer 200 may be formed.

Thereafter, as illustrated in FIG. 8B, first and second insulating materials 401 and 402 disposed on both surfaces 10A and 10B of the core portion 10 and burying the core portion 10 and the first and second electronic components D1 and D2 may be disposed. In this case, each of the first and second insulating materials 401 and 402 may bury the first and third metal layers 100 and 300, but the present disclosure is not limited thereto.

In addition, first and second circuit layers 501 and 502 may be disposed on one surface of each of the first and second insulating materials 401 and 402, and first and second through-vias TV1 and TV2 respectively passing through the first and second insulating materials 401 and 402 and respectively connecting connection pads D1P and D2P of the first and second electronic components and the first and second circuit layers 501 and 502 may be formed.

In this case, although not illustrated, third and fourth through-vias TV3 and TV4 passing through the first insulating material 401 and respectively connecting the connection pads D1P and D2P of the first and second electronic components and the first circuit layer 501 may be formed, but are not limited thereto.

Finally, as illustrated in FIG. 8C, at least a portion of each of the first and second circuit layers 501 and 502 may have first and second surface treatment layers ST1 and ST2 on one surface, first and second solder resist layers SR1 and SR2 may be further disposed on one surface of each of the second circuit layers 501 and 502. In this case, at least a portion of the first and second surface treatment layers ST1 and ST2 may be respectively exposed from the first and second solder resist layers SR1 and SR2, but are not limited thereto.

Since other descriptions may be applied in substantially the same manner as those described above, detailed descriptions thereof will be omitted.

An expression stating "one component is disposed on the other component" in the present specification may not be intended to establish a direction. Therefore, the expression stating "one component is disposed on the other component" may refer that the one component may be disposed on an upper side of the other component or may be disposed on a lower side of the other component.

In the present specification, terms such as upper surface, a lower surface, an upper side, a lower side, an uppermost side, a lowermost side, or the like may refer to a direction to be set based on the drawings for convenience of description. Therefore, depending on a direction to be set, the upper surface, the lower surface, the upper side, the lower side, the uppermost side, the lowermost side, or the like may be described as different terms.

As used herein, the term "connect" or "connection" in the present specification may not be only a direct connection, but also a concept including an indirect connection. In addition, the term "electrically connected" or "electrical connection" in the present specification is a concept including both a physical connection and a physical non-connection.

In the present specification, the expressions of "first," second," etc. in the present specification are used to distinguish one component from another, and do not limit the order and/or importance of the components. In some cases, without departing from the spirit of the present disclosure, a "first" component maybe referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

A circuit board and a manufacturing process of the circuit board according to the present disclosure are not limited thereto, and modifications and variations could be made without departing from the spirit and scope of the present disclosure by those skilled in the art.

As one effect among various effects of the present disclosure, a circuit board including a microcircuit and/or a micro via may be provided.

As one effect among various effects of the present disclosure, a circuit board on which a plurality of electronic components are efficiently mounted by processing a plurality of cavities having different diameters may be provided.

While example embodiments have been illustrated and described above, it will be apparent to those skilled in the art that modifications and variations could be made without departing from the scope of the present disclosure as defined by the appended claims.

What is claimed is:

1. A circuit board comprising:
a core portion including a first cavity disposed in one surface, and a second cavity disposed in the other surface opposing the one surface and having a diameter different from a diameter of the first cavity;
first and second electronic components respectively disposed in the first and second cavities of the core portion;
first and second insulating materials respectively disposed on the one surface and the other surface of the core portion to bury the core portion and the first and second electronic components;
a first metal layer disposed on the one surface of the core portion;
a second metal layer buried in the core portion, wherein at least a portion of the second metal layer extends from the first cavity of the core portion and to the second cavity of the core portion;
a via connecting the first and second metal layers to each other, wherein the via overlaps the second cavity of the core portion along a thickness direction of the circuit board; and
a third metal layer disposed on the other surface of the core portion.

2. The circuit board of claim 1, wherein for the first cavity of the core portion, a diameter of a region closer to the second metal layer is smaller than a diameter of a region closer to the first metal layer, and
for the second cavity of the core portion, a diameter of a region closer to the second metal layer is smaller than a diameter of a region closer to the third metal layer.

3. The circuit board of claim 1, wherein the second cavity has a bottom surface adjacent to the first cavity,
wherein at least a portion of the second metal layer extends from the bottom surface of the second cavity.

4. The circuit board of claim 1, wherein the core portion comprises a first core layer having the first cavity disposed therein, and a second core layer having the second cavity disposed therein.

5. The circuit board of claim 1, further comprising an adhesive layer disposed between the first and second electronic components.

6. The circuit board of claim 1, wherein at least a portion of at least one of the first and second electronic components is in contact with the second metal layer.

7. The circuit board of claim 1, further comprising first and second circuit layers disposed on one surface of each of the first and second insulating materials.

8. The circuit board of claim 7, wherein each of the first and second electronic components comprises a connection pad on one surface adjacent to the first and second circuit layers.

9. The circuit board of claim 8, further comprising first and second through-vias connecting each of the first and second circuit layers and each of the connection pads of the first and second electronic components and respectively passing through the first and second insulating materials,
wherein for each of the first and second through-vias, a diameter of a region closer to the connection pad of each of the first and second electronic components is smaller than a diameter of a region closer to each of the first and second circuit layers.

10. The circuit board of claim 7, wherein each of the first and second electronic components comprises a connection pad on a surface adjacent to the first circuit layer.

11. The circuit board of claim 10, further comprising:
a third through-via connecting the first circuit layer and the connection pad of the first electronic component and passing through the first insulating material; and
a fourth through-via connecting the first circuit layer and the connection pad of the second electronic component and passing through at least a portion of each of the first insulating material and the core portion,
wherein for each of the third and fourth through-vias, a diameter of a region closer to the connection pad of each of the first and second electronic components is smaller than a diameter of a region closer to each of the first and second circuit layers.

12. The circuit board of claim 7, further comprising:
first and second surface treatment layers disposed on one surface each of the first and second circuit layers; and
first and second solder resist layers disposed on the one surface each of the first and second circuit layers.

13. The circuit board of claim 1,
wherein for the via, a diameter of a region closer to the second metal layer is smaller than a diameter of a region closer to the first metal layer.

14. A circuit board comprising:
a core portion comprising:
a first core layer having a first cavity disposed therein, and
a second core layer having a second cavity disposed therein, the second cavity having a diameter different from a diameter of the first cavity, wherein at least a portion of the first core layer extends beyond the second core layer;
first and second electronic components respectively disposed in the first and second cavities;

first and second insulating materials respectively disposed on the first and the second core layer to bury the core portion and the first and second electronic components;
a first metal layer disposed on one surface of the first core layer;
a second metal layer disposed between the first core layer and the second core layer;
a via connecting the first and second metal layers to each other, wherein the via overlaps the second cavity along a thickness direction of the circuit board; and
a third metal layer disposed on one surface of the second core layer.

15. The circuit board of claim 14, wherein at least a portion of at least one of the first and second electronic components is in contact with the second metal layer.

16. The circuit board of claim 15, wherein the first cavity tapers along a stacking direction in which the first and second core layers are stacked.

17. A circuit board comprising: a core portion including a first cavity disposed in one surface, and a second cavity disposed in the other surface opposing the one surface and having a diameter different from a diameter of the first cavity; first and second electronic components respectively disposed in the first and second cavities of the core portion; first and second insulating materials respectively disposed on the one surface and the other surface of the core portion to bury the core portion and the first and second electronic components; first and second circuit layers disposed on one surface of each of the first and second insulating materials; each of the first and second electronic components comprising a connection pad on a surface adjacent to the first circuit layer; a third through-via connecting the first circuit layer and the connection pad of the first electronic component and passing through the first insulating material; a fourth through-via connecting the first circuit layer and the connection pad of the second electronic component and passing through at least a portion of each of the first insulating material and the core portion, wherein for each of the third and fourth through- vias, a diameter of a region closer to the connection pad of each of the first and second electronic components is smaller than a diameter of a region closer to each of the first and second circuit layers; a first metal layer disposed on the one surface of the core portion; a second metal layer buried in the core portion, wherein at least a portion of the second metal layer extends from the first cavity of the core portion and into the second cavity of the core portion; and a third metal layer disposed on the other surface of the core portion.

* * * * *